Aug. 23, 1966 N. W. BRADY 3,268,775

SPACER MEANS IN COMBINATION WITH ELECTRICAL APPARATUS MOUNTED ON PANEL STRUCTURE

Filed Nov. 19, 1964

INVENTOR.
NORTON W. BRADY

BY

Harry W. Hargis III
AGENT

United States Patent Office 3,268,775
Patented August 23, 1966

3,268,775

SPACER MEANS IN COMBINATION WITH ELECTRICAL APPARATUS MOUNTED ON PANEL STRUCTURE

Norton W. Brady, Ambler, Pa., assignor to Philco Corporation, Philadelphia, Pa., a corporation of Delaware
Filed Nov. 19, 1964, Ser. No. 412,377
1 Claim. (Cl. 317—101)

This invention relates to means for mounting electrical appartus, and more particularly to a novel method of and apparatus for spacing electronic components from supporting structure.

It is a known practice to mount electronic components upon supporting structure, such as panel means provided with electrical conductors for interconnecting operating circuits of the components. In general, leads of the electronic components extend through apertures provided in the circuit panel and are bent toward terminal portions of conductors disposed on the opposite side of the panel. Electrical connections between the component leads and the conductors are completed by subsequent soldering operations.

A number of advantages derive from using spacer means interposed between components and panel means of the aforementioned type. Compenents such as transistors advantageously are thermally insulated by the spacers from the wiring panel during soldering operations. Also, spacing of transistors above the panel provides for convectional cooling of the transistors during operation. Cooling is particularly important in the case of modular assemblies comprising large numbers of transistors, resistors, and like components, crowded together in compact structures.

It is desirable in the frabrication of a known preferred form of modular assembly to provide lateral access to lead wires of various of the components, to permit insertion of tools in performance of the staking and bending operations prior to solder connection of the wires. However, this mode of attachment has presented problems, since the relatively rigid spacers heretofore available have interfered with tools operable to stake the wires in apertures provided in the panel.

It is a primary objective of this invention to provide spacer means adapted for disposition between a transistor base and its associated mounting panel, which spacer means is sufficiently flexible in a direction transverse the direction of spacing to accommodate lateral insertion of a lead wire staking tool.

It is another object of the invention to provide such spacer means adapted to enhance both cooling of a mounted component during its operation and dissipation of heat normally encountered during a soldering operation.

It is a further objective of the invention to provide a novel method useful in assembling an electrical device and spacer means therefor.

In accordance with preferred practice of the invention, spacer means adapted for disposition between a transistor housing and a wiring panel comprises a bifurate electrically insulative body that is positionable to engage one wire of an array of transistor lead wires at the juncture of its branch portions so that the branch portions may be resiliently flexed into engagement with the other lead wires. Such engagement is effective frictionally to maintain the spacer affixed to said transistor prior to and during mounting of the transistor upon its panel.

The invention further contemplates that the flexed branch portions of the spacer means be capable of further flexure upon engagement of the portions by a wire staking tool insertable between the panel and the spaced transistor housing to wedge the wires into generally V-shaped slots formed in the edges of the panel.

For a more detailed understanding of the invention and the manner in which its objectives and advantages may best be achieved, reference may be made to the following description taken with the accompanying drawing in which.

Figures 1, 2, 3, 4, 5:
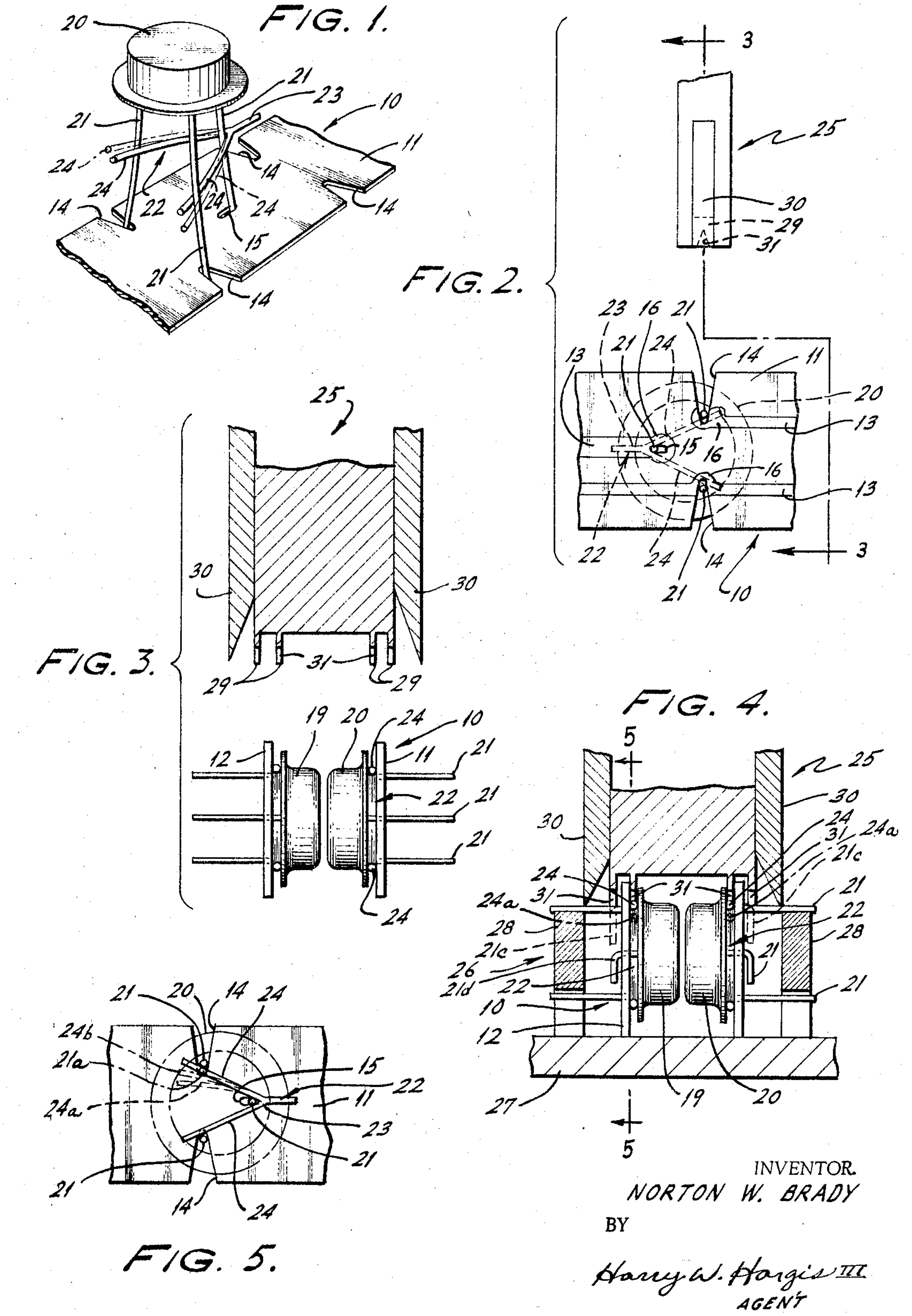
FIGURE 1 is an exploded view, in perspective, of a fragmented panel portion showing a transistor and spacer on a greatly enlarged scale and prior to staking.
FIGURE 2 is a bottom view of the apparatus illustrated in FIGURE 1, in combination with tools to be used during assembly.
FIGURE 3 is a view, partly in section, looking in the direction of arrows 3—3 applied to FIGURE 2.
FIGURES 4 and 5 are additional views illustrating steps in the assembly of apparatus embodying the invention.

With more detailed reference to the drawing, and first with reference to FIGURES 1, 2, and 3, elements of an exemplary modular assembly 10 may comprise a pair of spaced, parallel printed wiring panels 11 and 12 provided with circuit elements, for example conductors of the so-called "printed" type shown at 13. Mounting of a transistor only will be illustrated in the present disclosure which is directed to novel means for spacing such a device from a panel. However, it will be understood that a modular assembly of the type illustrated may comprise other components, such s resistors and the like, extending transversely of the panels 11 and 12 and connected by their lead wires to panel-carried circuits, effectively spacing and maintaining the panels in the illustrated parallel spaced relationship shown in FIGURES 3 and 4. Each panel includes apertures 15 and peripherally disposed, outwardly presented generally V-shaped notches 14, each notch and aperture being illustrated adjacent a terminal portion 16 of a circuit element 13. It will be understood that the spacer means hereinafter to be described may be used with devices other than transistors, and may be used in combination with panel boards other than the type shown. Also, circuit elements 13 may take other forms, the invention not being limited as to the interconnecting circuitry.

With reference also to FIGURES 4 and 5, a transistor 20 has a triangularly disposed array of lead wires 21 projecting substantially unidirectionally away from the generally planar base portion of the transistor housing. Each of wires 21 is insertable in the illustrated notches 14 and apertures 15 of panel 11. A second transistor 19 is similarly disposed with respect to left hand panel 12. The invention will be described with reference only to transistor 20 and the mode of mounting same.

Prior to insertion of transistor 20, and in especial accordance with the invention, a generally wishbone-like shape bifurcate spacer 22 made of a suitable flexible and resilient insulative material is provided as seen in FIGURE 1. While the spacer illustrated has a circular cross section, it will be understood from what follows that it may take other shapes at the convenience of the user. Spacer 22 is further, and importantly, so configured that, in its unflexed rest position (broken lines, FIGURE 1) and with one of lead wires 21 embraced by the juncture 23 of branch portions 24, the latter portions would normally diverge to extend "outboard" of the other two lead wires 21 of the triangular array. To affix spacer 22 to transistor 20, the juncture is positioned as described above, branch portions 24 are flexed toward one another and moved to a posiiton "inboard" of the wires 21, and the spacer is moved along the wires to a position adjacent the base portion of the transistor, as seen in FIGURES 3 and 4. The branch portions 24 are then released to flex or spring outwardly to a position in which they forcibly engage two of the lead wires 21 (solid lines, FIGURE 5) while the third wire is engaged by the juncture. The resultant forces exerted against the lead wires 21 by the flexed branch portions 24 are in a direction tending to urge juncture 23 of the branch portions against the adjacent lead wire 21, whereby spacer 22 is effectively locked in place to remain in this position throughout subsequent handling of the transistor. As shown in FIGURES 1 and 5 of the drawing, where it is shown that the spacer contacts the leads without moving them outwardly in the notches 14, it will be appreciated that the spacer is of high flexibility and resilience as compared with the flexibility and resilience of the lead wires 21.

In considering further assembly of the apparatus 10, additional important features of the invention will be appreciated. In such assembly, transistor 20 is positioned, as illustrated in FIGURES 2 and 3, by insertion of leads 21 in apertures 14 and 15, after which the transistor is moved into close proximity to the panel, sandwiching spacer 22 between the base of the transistor and the panel. The partially assembled module 10 is then positioned in alignment with a combined staking and cutting tool 25 while supported by a fixture 26 (FIGURE 4) provided with a base portion 27 that supportingly engages edges of panels 11 and 12, and anvil portions 28 that engage upper lead wires 21. Tool 25 is then moved toward fixture 26 to engage upper wires 21 by V-shaped notches 31 of staking portions 29, followed by forcibly urging these wires into panel slots 14 where they are frictionally retained in the positions designated by the numeral **21*a* in FIGURE 5. Substantially simultaneously with the staking operation, cutting blades 30 move downwardly to sever excess portions of wires 21, blades 30 thereafter continuing downwardly, while leads 21 are held in the slots, to bend the leads (see broken lines) toward terminal portions of the circuit elements to positions 21*c*. There is also illustrated in broken lines in FIGURE 5 the flexure of the spacer branch portions to positions 24*a* under the urging of staking portions 29 of tool 25 inserted between the panel and the transistor base. The branch portions return to the full line positions designated by numeral 24*b* upon retraction of the staking portions of the tool from between the base and the transistor. After the tool is retracted, assembly 10 is inverted, and the operation is repeated for the other lead wires in slots 14 disposed along the opposite edge. Thereafter, the center wire 21 extending through aperture 15 is cut by suitable means and bent toward the panel as shown at 21*d*** (FIGURE 4). At this stage the assembly is available for subsequent operations, such for example as the addition of other types of components and the soldering of wire leads to terminal portions of the circuit elements.

From the foregoing it will be appreciated that the invention provides simple and effective means for spacing an electrical component from a supporting structure, which means includes novel spacing elements capable of flexure to accommodate mounting and staking operations, while yet being very effective in achieving their spacing functing.

I claim:

In electrical apparatus, an insulative panel having wiring circuits extending across surface portions thereof and provided with electrical terminal means, said panel further having apertures extending therethrough in the region of said terminal means, an electrical device including a generally planar surface portion disposed in spaced relationship with respect to a surface portion of said panel, said device having a triangular array of substantially unidirectionally presented leads extending through said apertures and into electrical connection with said terminal means, and means for maintaining the recited spaced relationship between said device and said panel without significant spreading of the leads, comprising: an insulative spacer of generally wishbone-like shape, said spacer being of high flexibility and resilience as compared with the flexibility and resilience of the leads and including a bifurcate body portion disposed between and engaging the recited surface portions of said panel and said device and a stabilizing spacer section lying generally in the plane of said bifurcate portion and extending in a direction opposite to the direction of extension of the branches of said bifurcate portion, said stabilizing spacer section also engaging the recited surface portions of said panel and said device, the inner juncture of the bifurcate branches of said spacer being engaged with and pressed against one of said leads, and said branches being so flexed as to be urged outwardly and resiliently pressed against the other leads, whereby to maintain the recited engagement of said inner juncture with said one lead and to resist displacement of said spacer from between said surface portions.

References Cited by the Examiner

UNITED STATES PATENTS 3,184,536 5/1965 Vincent ----------- 174—138

OTHER REFERENCES

Assmann et al., German application No. 1,070,707, pub. Dec. 10, 1959.

LARAMIE E. ASKIN, *Primary Examiner.*

ROBERT K. SCHAEFER, *Examiner.*